(12) United States Patent
Blanchard

(10) Patent No.: US 6,769,166 B1
(45) Date of Patent: Aug. 3, 2004

(54) METHOD OF MAKING AN ELECTRICAL CURRENT SENSOR

(75) Inventor: Hubert Blanchard, Vevey (CH)

(73) Assignee: Liaisons Electroniques-Mecaniques LEM SA, Plan-les-Ouates (CH)

( * ) Notice: Subject to any disclaimer, the term of this patent is extended or adjusted under 35 U.S.C. 154(b) by 0 days.

(21) Appl. No.: 09/503,349

(22) Filed: Feb. 14, 2000

(30) Foreign Application Priority Data

Feb. 25, 1999 (CH) ........................................ 199 0350/99

(51) Int. Cl.[7] .............................. G01R 3/00; H05K 3/30; B44C 1/22

(52) U.S. Cl. .............................. 29/595; 29/593; 29/835; 29/841; 216/41; 324/251; 324/252; 430/313; 430/326; 430/318

(58) Field of Search ........................ 29/593, 594, 595, 29/609.1, 835, 603.15, 603.18, 841; 216/4 D, 41; 324/251, 252; 338/32 H; 430/326, 313, 318

(56) References Cited

U.S. PATENT DOCUMENTS

| | | | | |
|---|---|---|---|---|
| 4,021,767 A | * | 5/1977 | Nonaka | 338/32 H |
| 4,568,905 A | * | 2/1986 | Suzuki | 338/32 H |
| 4,568,906 A | * | 2/1986 | De Wilde | 338/32 R |
| 4,584,552 A | * | 4/1986 | Suzuki | 338/32 H |
| 5,218,279 A | * | 6/1993 | Takahashi | 318/560 |
| 5,266,917 A | * | 11/1993 | Bleeke | 338/32 H |
| 6,191,581 B1 | * | 2/2001 | Van Dau | 324/249 |
| 6,198,609 B1 | * | 3/2001 | Barr | 360/322 |
| 6,340,886 B1 | * | 1/2002 | Daughton | 324/252 |

FOREIGN PATENT DOCUMENTS

EP 0772046 A2 10/1996

* cited by examiner

*Primary Examiner*—A. Dexter Tugbang
(74) *Attorney, Agent, or Firm*—Clifford W. Browning; Woodard Emhardt Moriarty McNett & Henry LLP

(57) ABSTRACT

A method of making an electrical current sensor having an electrical conducting portion (6; 6a, 6b) of rectangular cross-section being surrounded, on three of its lateral faces, by a magnetic circuit portion (7) which has end portions (7', 7") having planar surfaces situated substantially in a plane of a fourth lateral face of the conductor portion (6), a magnetic field detector (3; 24; 26) being arranged opposite the fourth lateral face. The conductor portion (6) is made by photo-lithography and etching in a layer of electrically conducting material applied on a first surface of a flat support member (1; 1'; 1") or on intermediate layers (8, 9, 10, 11) deposited on the support member. The magnetic circuit portion (7) is made by photo-lithography and etching in a layer of magnetically permeable material applied on the conductor portion (6) on the first surface of the support member (1; 1', 1") or of an intermediate layer (8). The magnetic field detector (3; 26) is fixed to the support member (1; 1', 1") or on intermediate layers (9, 10, 11) deposited on a second surface of the support member.

15 Claims, 2 Drawing Sheets

METHOD OF MAKING AN ELECTRICAL CURRENT SENSOR

BACKGROUND OF THE INVENTION

The present invention relates to a method of making an electrical current sensor for measuring a current by detecting the magnetic field generated by this current, the sensor comprising at least one electrical conductor portion of substantially rectangular cross-section having extremities arranged to enable connection of this conductor portion in series with two conductors carrying the current to be measured, said conductor portion being surrounded on three of its lateral faces by a magnetic circuit portion comprising ends having plane surfaces situated substantially in the plane of a fourth lateral face of said conductor portion, a magnetic field detector being arranged opposite said fourth lateral face.

The basic construction of such a sensor is described in the document EP 0 772 046 A2.

The production of known sensors by conventional methods leads to relatively high costs, in particular due to the cost of assembling different parts of the sensor.

BRIEF SUMMARY OF THE INVENTION

The object of the present invention is to provide a method of making a sensor adapted to mass production, enabling in particular simplification of assembly and production of a large number of sensors simultaneously, so as to substantially reduce production costs.

A further object of the invention is to provide sensors with very good performance, in particular as concerns the range of measure of current intensity and sensitivity of the sensor, while ensuring good protection against the influence of parasitic magnetic fields.

Objects of the invention have been achieved by the method of making a sensor according to claim 1.

Particular embodiments of the invention are set forth in claims 2 to 15.

Other objects and advantageous features of the invention will be apparent from the following description and drawings.

DETAILED DESCRIPTION OF THE INVENTION

Figure 1:
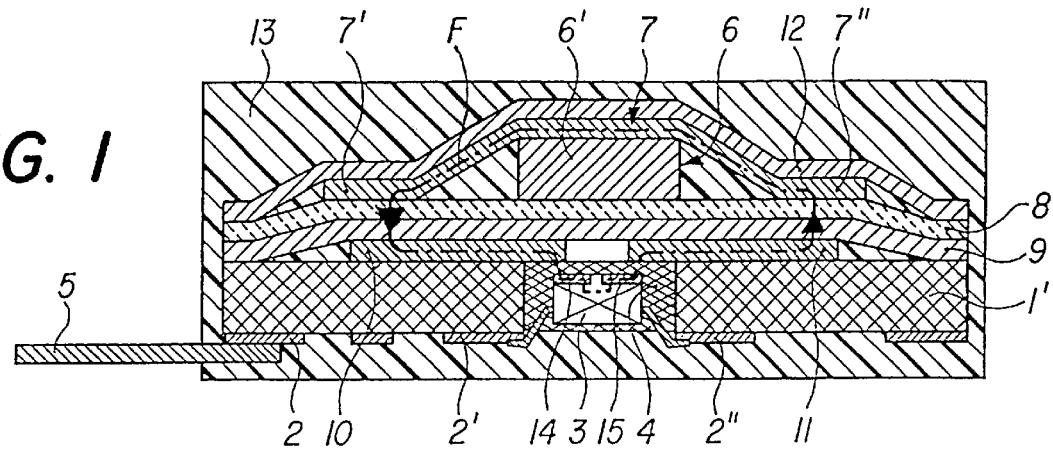
FIG. 1 is a cross-sectional view through a current sensor according to the invention.

Referring to FIG. 1, a sensor made according to the method of the invention comprises a support member 1', such as a printed circuit board or flexible film having metallized portions 2 on a surface thereof that form, in particular, electrical connection tracks. In the example of FIG. 1, the support member in the form of a board 1' is provided with an opening which receives a magnetic field detector 3, such as a Hall effect detector, encapsulated in a housing 4 similar to commercially available housings. The detector 3 is fixed and connected to metallic portions 2', 2" by soldering, the metallic portions 2', 2" being interconnected via connection tracks to connectors 5, 5', 5" to be soldered on corresponding metallized portions 2.

Figure 2:
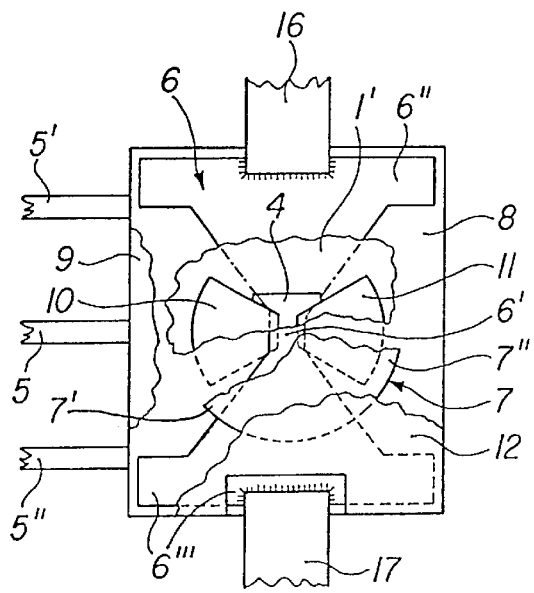
FIG. 2 is a view of an underside of a sensor according to FIG. 1 wherein certain portions have been removed.

In FIGS. 1 and 2, a portion of electrical conductor through which a current I to be measured flows, is designated by the reference 6. This conductor portion having a flat shape and a substantially rectangular cross section, comprises a reduced section in a direction perpendicular to the direction of the current I flowing between the connectors or conductors 16 and 17 which are to be soldered on the opposed ends of the portion 6. This portion 6 thus comprises a portion 6' of reduced cross section and length in which the current density is significantly greater than in the portions 6" and 6'" situated upstream and downstream of the portion 6' and which enable, due to their relatively large surfaces, the dissipation of heat produced by the current.

The portion 6' and neighbouring areas of the conductor portion 6 are surrounded, on three of their lateral faces, by a magnetic circuit portion 7 whose border is substantially circular in the embodiment shown. The conductor portion 6 is glued on an electrically insulating layer 8 and the magnetic circuit portion 7 is glued, on the one hand, on the portion 6 and, on the other hand, along two peripheral portions 7', 7" on this electrical insulating layer 8. An electrical shielding layer 9 is provided under the layer 8, for connection to earth. Between the shielding layer 9 and the board 1', two magnetic flux concentrating portions 10 and 11 are arranged, the portions having shapes substantially of two trapezoids whose small sides are placed opposite each other, the large sides having, for example, approximately the shape of arcs of circles, as represented in FIG. 2.

The magnetic circuit constituted by the portions 7 and the portions 10 and 11 is provided with an air-gap between the small sides, this air-gap being placed in the proximity of a detector 3, such that the magnetic field produced by the current I influences this detector. FIG. 1 shows, in particular, the use of a detector comprising integrated flux concentration members that enable the sensitivity of the current detector to be increased by recovering the leakage flux between the portions 10 and 11. A line of mean flux F traced in dotted lines indicates the flow of magnetic flux through the sensor.

As concerns the respective shapes and dimensions of the portions 7, 10 and 11 of the magnetic circuit of the sensor, it should be noted that the portion 7 has a circular or elliptical shape overlapping at least the portions 10 and 11 so as to ensure good shielding with respect to external magnetic fields. A larger width of the portion 7 in the transverse direction with respect to the current flow direction, as is obtained in the shape of an ellipse whose large axis is perpendicular to the current flow direction, further increases the sensitivity of the sensor. On the other hand, a larger width of the portion 7 in the current flow direction procures a greater level of saturation and, as a consequence, enables the measurement of currents of greater intensity. In practice, a compromise must be found between these two effects for given applications.

Figure 3:
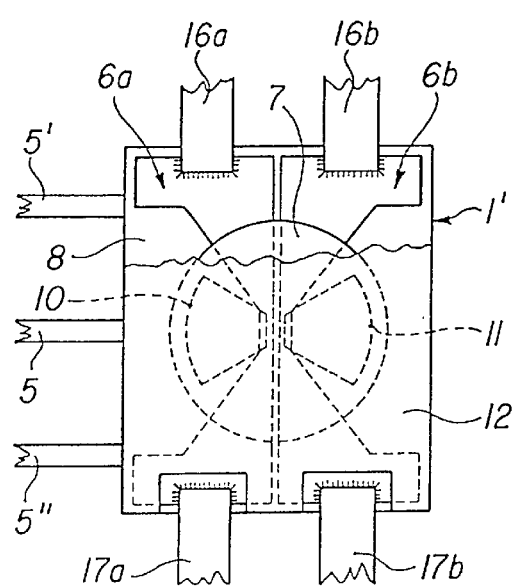
FIG. 3 is a view of the underside of a sensor similar to that of FIG. 2, but adapted for the differential measure of two currents.

FIG. 3 shows the structure of a sensor for the differential measure of two currents Ia and Ib flowing in opposite directions. In this case, the portion 6 is divided in two portions 6a and 6b separated by a slit extending in the current flow direction and electrically insulated from each other, for example by an insulating varnish layer. The portions 6a and 6b are connected, respectively, to connectors 16a, 17a and 16b, 17b. The remaining part of the sensor is similar in structure to that of FIG. 2 and the same reference numbers are used to designate corresponding parts. The magnetic detector measures the magnetic field resulting from the difference between the currents flowing in each of the portions 6a and 6b.

Figure 4:
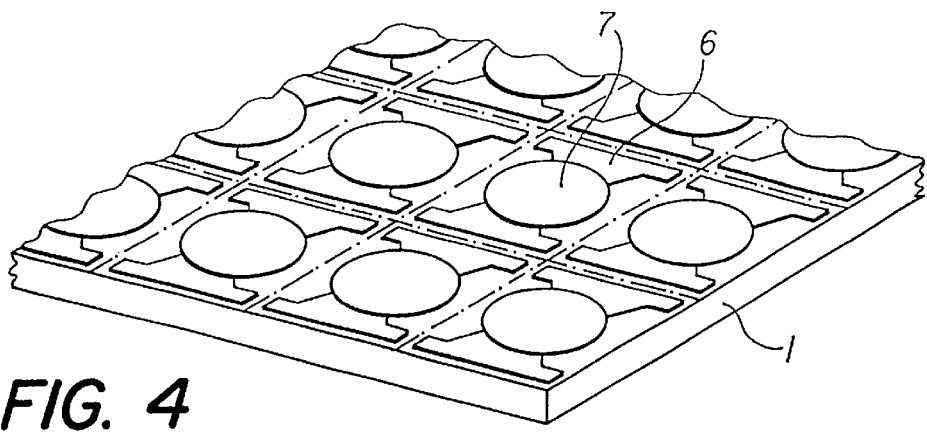
FIG. 4 is a partial perspective view of a circuit board for making a plurality of sensors according to the invention, at an intermediate stage of manufacturing.

The present method of making a current sensor consists in providing, on a support such as a printed circuit board, the different elements by the deposit of successive layers to form a sandwich or wafer construction, for example according to FIG. 1. In practice, a plurality of sensors are provided simultaneously, for example on a main board 1, as shown in FIG. 4. After providing the different layers, the board is cut along the dotted lines such that the individual sensors are provided with the board 1' corresponding to a portion of the board 1. The detectors may be mounted before or after cutting the main board. The connectors 5, 5', 5" are soldered on the metallized portions 2, as the case may be, and subsequently the sensors are covered with an encapsulation resin 13 ensuring the electrical insulation as well as the mechanical stability and protection of the device. This resin may also flow into empty spaces that remain inside the sensor after formation of the different layers.

The layers in which a specific shape is given to portions of the sensor, such as portions 7, 10 and 11 constituting the magnetic circuit, the magnetic shielding layer 12 and the conductor portion 6, are processed by photo-lithography and etching according to known methods. The final shape of the other layers is obtained during cutting of the sandwich or wafer.

FIGS. 5 to 8 show different examples of sensor constructions provided according to the present invention. In these Figures, the analog portions and particularly those described in FIG. 1 have been designated with the same reference numbers and their description and function may be understood from the foregoing and is not repeated hereafter.

Figure 5:
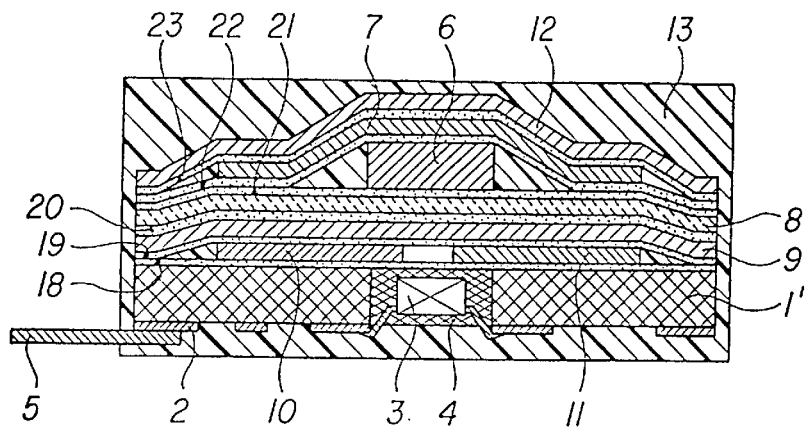
FIGS. 5 to 8 are cross sectional views of different embodiments respectively of a sensor according to the invention.

The embodiment of FIG. 5 corresponds to the construction of FIG. 1 but shows in addition the use of different adhesive layers. The adhesive layer 18 enables the layer of ferromagnetic material in which the portions 10 and 11 are formed to be adhered on the board 1 and the adhesive layers 19, 20 and 21 ensure, respectively, the adhesive attachment of electrically shielding layer 9 on the portions 10 and 11 and subsequently the attachment of the electrically insulating layer 8 and that of the layer for forming the conductor portion 6, one on top of the other. Thereafter, the layer in which the portion 7 is formed on the portion 6 is applied by means of an adhesive layer 22. Finally, the external magnetic shielding layer is applied using the adhesive layer 23.

Figure 6:
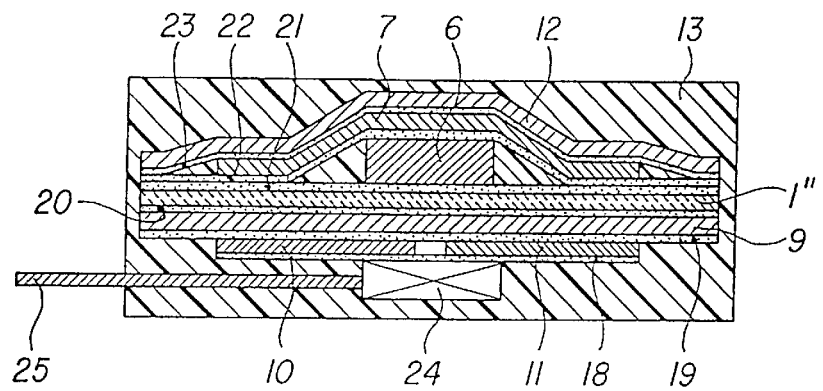

In the embodiment of FIG. 6, a support board 1" of insulating material is used, on which the layers for provision of the conductor portion 6 and the magnetic circuit portion 7 as well as the shielding layer 12 are applied one on top of the other, as previously described. The layer for forming the flux concentration portions 10 and 11 is adhered to the opposite surface of the board 1". Finally, a detector 24 encapsulated in a housing is adhered to the portions 10 and 11. The connectors 25 extending out of the housing are maintained in position during encapsulation by the resin 13.

Figure 7:
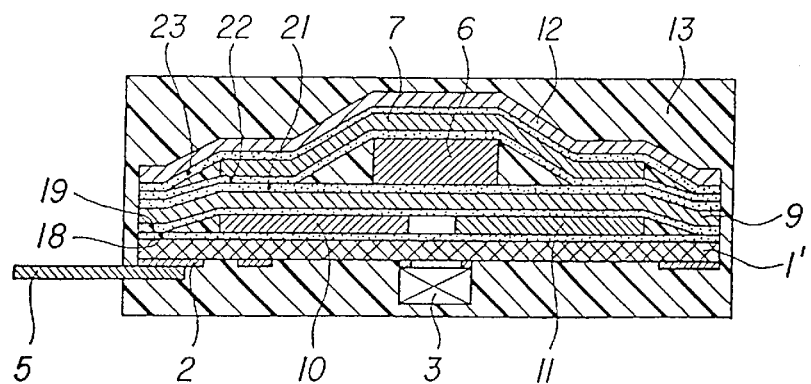

FIG. 7 shows an example of the mounting of a detector in the form of an integrated circuit of the type "flip chip" under the printed circuit board 1' comprising connection tracks 2.

Figure 8:
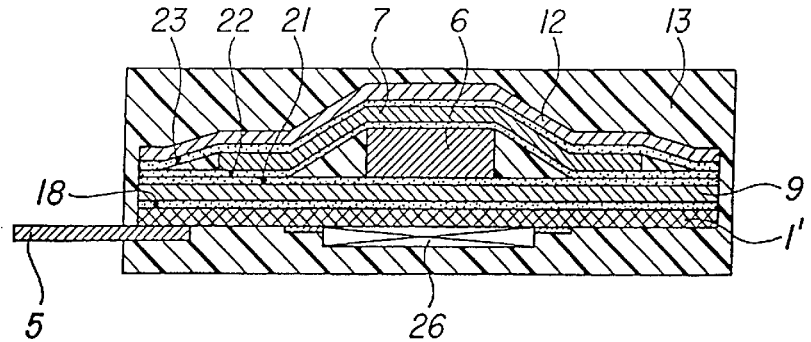

The embodiment of FIG. 8 uses a detector consisting of a magneto-resistive ferromagnetic element 26 which also serves to close the magnetic circuit of the sensor.

It is apparent from the foregoing that the invention enables the production of sensors with good performance at low cost, particularly due to an optimization of the shape and dimensions of the constitutive portions of these sensors. Such sensors thus have a large field of application, for example in electrical motor control devices, in energy measuring devices, electronic fuses, etc.

What is claimed is:

1. A method of making an electrical current sensor for measuring a current (I; Ia, Ib) by detecting a magnetic field generated by this current, said sensor comprising at least one electrical conducting portion (6; 6a, 6b) of substantially rectangular cross-section having ends arranged so as to enable connection of said conductor portion in series with two conductors carrying the current to be measured, said conductor portion being surrounded, on three of said connector portion's lateral faces, by a magnetic circuit portion (7) which comprises end portions (7', 7") having planar surfaces situated substantially in a plane of a fourth lateral face of said conductor portion (6), a magnetic field detector (3; 24; 26) being arranged opposite said fourth lateral face, wherein said conductor portion (6) is made by photo-lithography and etching in a layer of electrically conducting material applied on a first surface of a flat support member (1; 1'; 1") or on one or more intermediate layers of intermediate layer portions (8, 9, 10, 11) deposited on said first surface of this support member;

said magnetic circuit portion (7) is made by photo-lithography and etching in a layer of magnetically permeable material applied on said conductor portion (6) and on portions of said first surface of the support member (1; 1', 1") or of an intermediate layer (8); and said magnetic field detector (3; 26) is fixed to said support member (1; 1', 1") or on one or more layers or portions of intermediate layers (9, 10, 11) deposited on a second surface of the support member opposed to said first surface thereof.

2. A method according to claim 1 for making a sensor comprising flat magnetic flux concentration portions (10, 11) arranged, respectively, at least partially, opposite said end portions (7', 7") of said magnetic circuit portion, wherein said magnetic flux concentration portions are made by photo-lithography and etching in a layer of magnetically permeable material forming an intermediate layer between said support member (1, 1') and said conductor portion (6).

3. A method according to claim 1 for making a sensor comprising flat magnetic flux concentration portions (10, 11) arranged respectively, at least partially, opposite said end portion (7', 7") of said magnetic circuit, wherein said magnetic flux concentration portions are made by photo-lithography and etching in a magnetically permeable material forming an intermediate layer between said support member (1, 1") and said magnetic field detector (24).

4. A method of making an electrical current sensor for measuring a current (I; Ia, Ib) by detecting a magnetic field generated by this current, said sensor comprising at least one electrical conducting portion (6; 6a, 6b) of substantially rectangular cross-section having ends arranged so as to enable connection of said conductor portion in series with two conductors carrying the current to be measured, said conductor portion being surrounded, on three of said conductor portion's lateral faces, by a magnetic circuit portion (7) which comprises end portions (7', 7") having planar surfaces situated substantially in a plane of a fourth lateral face of said conductor portion (6), a magnetic field detector (3; 24; 26) being arranged opposite said fourth lateral face, wherein said conductor portion (6) is made by photo-lithography and etching in a layer of electrically conducting material applied on a first surface of a flat support member (1; 1'; 1") or on one or more intermediate layers or intermediate layer portions (8, 9, 10, 11) deposited on said first surface of this support member;

said magnetic circuit portion (7) is made by photo-lithography and etching in a layer of magnetically permeable material applied on said conductor portion (6) and on portions of said first surface of the support member (1; 1', 1") or of an intermediate layer (8); and said magnetic field detector (3; 26) is fixed to said support member (1; 1', 1") or on one or more layers or portions of intermediate layers (9, 10, 11) deposited on a second surface of the support member opposed to said first surface thereof and wherein an electrical shielding layer (9) in an electrical conducting material is applied as an intermediate layer between said conductor portion (6) and said magnetic field detector (3; 24; 26).

5. A method according to claim 4, wherein an electrical insulating layer (8) is applied as intermediate layer between said conductor portion (6) and said support member or said electrical shielding layer (9).

6. A method of making an electrical current sensor for measuring a current (I; Ia, Ib) by detecting a magnetic field generated by this current, said sensor comprising at least one electrical conducting portion (6; 6a, 6b) of substantially rectangular cross-section having ends arranged so as to enable connection of said conductor portion in series with two conductors carrying the current to be measured, said conductor portion being surrounded, on three of said conductor portion's lateral faces, by a magnetic circuit portion (7) which comprises end portions (7', 7") having planar surfaces situated substantially in a plane of a fourth lateral face of said conductor portion (6), a magnetic field detector (3; 24; 26) being arranged opposite said fourth lateral face, wherein said conductor portion (6) is made by photo-lithography and etching in a layer of electrically conducting material applied on a first surface of a flat support member (1; 1'; 1") or on one or more intermediate layers or intermediate layer portions (8, 9, 10, 11) deposited on said first surface of this support member;

said magnetic circuit portion (7) is made by photo-lithography and etching in a layer of magnetically permeable material applied on said conductor portion (6) and on portions of said first surface of the support member (1; 1', 1") or of an intermediate layer (8); and said magnetic field detector (3; 26) is fixed to said support member (1; 1', 1") or on one or more layers or portions of intermediate layers (9, 10, 11) deposited on a second surface of the support member opposed to said first surface thereof and wherein said magnetic circuit portion (7) is provided with a substantially circular or elliptical border.

7. A method according to claim 6 wherein said magnetic circuit portion (7) has the shape of an ellipse whose large axis is oriented in the direction perpendicular to the current flow direction.

8. A method according to claim any one of the preceding claims, wherein a magnetic shielding layer (12) of magnetically permeable material is applied on said magnetic circuit portion.

9. A method of making an electrical current sensor for measuring a current (I; Ia, Ib) by detecting a magnetic field generated by this current, said sensor comprising at least one electrical conducting portion (6; 6a, 6b) of substantially rectangular cross-section having ends arranged so as to enable connection of said conductor portion in series with two conductors carrying the current to be measured, said conductor portion being surrounded, on three of said conductor portion's lateral faces, by a magnetic circuit portion (7) which comprises end portions (7', 7") having planar surfaces situated substantially in a plane of a fourth lateral face of said conductor portion (6), a magnetic field detector (3; 24; 26) being arranged opposite said fourth lateral face, wherein said conductor portion (6) is made by photo-lithography and etching in a layer of electrically conducting material applied on a first surface of a flat support member (1; 1'; 1") or on one or more intermediate layers or intermediate layer portions (8, 9, 10, 11) deposited on said first surface of this support member;

said magnetic circuit portion (7) is made by photo-lithography and etching in a layer of magnetically permeable material applied on said conductor portion (6) and on portions of said first surface of the support member (1; 1', 1") or of an intermediate layer (8); and said magnetic field detector (3; 26) is fixed to said support member (1; 1', 1") or on one or more layers or portions of intermediate layers (9, 10, 11) deposited on a second surface of the support member opposed to said first surface thereof and wherein said support member is a printed circuit board or a flexible printed circuit.

10. A method of making an electrical current sensor for measuring a current (I; Ia, Ib) by detecting a magnetic field generated by this current, said sensor comprising at least one electrical conducting portion (6; 6a, 6b) of substantially rectangular cross-section having ends arranged so as to enable connection of said conductor portion in series with two conductors carrying the current to be measured, said conductor portion being surrounded, on three of said conductor portion's lateral faces, by a magnetic circuit portion (7) which comprises end portions (7', 7") having planar surfaces situated substantially in a plane of a fourth lateral face of said conductor portion (6), a magnetic field detector (3; 24; 26) being arranged opposite said fourth lateral face, wherein said conductor portion (6) is made by photo-lithography and etching in a layer of electrically conducting material applied on a first surface of a flat support member (1; 1'; 1") or on one or more intermediate layers or intermediate layer portions (8, 9, 10, 11) deposited on said first surface of this support member;

said magnetic circuit portion (7) is made by photo-lithography and etching in a layer of magnetically permeable material applied on said conductor portion (6) and on portions of said first surface of the support member (1; 1', 1") or of an intermediate layer (8); and said magnetic field detector (3; 26) is fixed to said support member (1; 1', 1") or on one or more layers or portions of intermediate layers (9, 10, 11) deposited on a second surface of the support member opposed to said first surface thereof and wherein said magnetic field detector (3) is a Hall effect detector comprising magnetic flux concentration elements (14, 15) integrated in said detector.

11. A method as in one of claims 1–7, wherein said support member (1', 1") is a portion of a main support member (1) for simultaneously producing a plurality of current sensors, said layers being applied successively on one of the surfaces of this support member and subsequently cut in portions corresponding to said support members of individual sensors.

12. A method according to claim 2 or 3, wherein said conductor portion (6) comprises a reduced section in the direction perpendicular to the current flow direction in order to concentrate the current on a portion (6') of reduced length of the conductor portion, and that said magnetic flux concentration portions (10, 11) each have an approximately trapezoidal shape and are arranged such that their small sides are placed opposite each other and facing said portion (6') of reduced length of the conductor portion.

13. A method of making an electrical current sensor for measuring a current (I; Ia, Ib) by detecting a magnetic field generated by this current, said sensor comprising at least one electrical conducting portion (6; 6a, 6b) of substantially rectangular cross-section having ends arranged so as to enable connection of said conductor portion in series with two conductors carrying the current to be measured, said conductor portion being surrounded, on three of said conductor portion's lateral faces, by a magnetic circuit portion (7) which comprises end portions (7', 7") having planar surfaces situated substantially in a plane of a fourth lateral face of said conductor portion (6), a magnetic field detector (3; 24; 26) being arranged opposite said fourth lateral face, wherein said conductor portion (6) is made by photo-lithography and etching in a layer of electrically conducting material applied on a first surface of a flat support member (1; 1'; 1") or on one or more intermediate layers or intermediate layer portions (8, 9, 10, 11) deposited on said first surface of this support member;

said magnetic circuit portion (7) is made by photo-lithography and etching in a layer of magnetically permeable material applied on said conductor portion (6) and on portions of said first surface of the support member (1; 1', 1") or of an intermediate layer (8); and said magnetic field detector (3; 26) is fixed to said support member (1; 1', 1") or on one or more layers or portions of intermediate layers (9, 10, 11), which include magnetic flux concentration portions (10, 11, deposited on a second surface of the support member opposed to said first surface thereof and wherein said magnetic circuit portion (7) is dimensioned such that it overlaps at least said flux concentration portions (10, 11).

14. A method of making an electrical current sensor for measuring a current (I; Ia, Ib) by detecting a magnetic field generated by this current, said sensor comprising at least one electrical conducting portion (6; 6a, 6b) of substantially rectangular cross-section having ends arranged so as to enable connection of said conductor portion in series with two conductors carrying the current to be measured, said conductor portion being surrounded, on three of said conductor portion's lateral faces, by a magnetic circuit portion (7) which comprises end portions (7', 7") having planar surfaces situated substantially in a plane of a fourth lateral face of said conductor portion (6), a magnetic field detector (3; 24; 26) being arranged opposite said fourth lateral face, wherein said conductor portion (6) is made by photo-lithography and etching in a layer of electrically conducting material applied on a first surface of a flat support member (1; 1'; 1") or on one or more intermediate layers or intermediate layer portions (8, 9, 10, 11) deposited on said first surface of this support member;

said magnetic circuit portion (7) is made by photo-lithography and etching in a layer of magnetically permeable material applied on said conductor portion (6) and on portions of said first surface of the support member (1; 1', 1") or of an intermediate layer (8); and said magnetic field detector (3; 26) is fixed to said support member (1; 1', 1") or on one or more layers or portions of intermediate layers (9, 10, 11) deposited on a second surface of the support member opposed to said first surface thereof and wherein two conductor portions insulated with respect to each other are provided, said magnetic circuit portion (7) and said magnetic field detector (3; 24; 26) being arranged such that they are influenced by currents flowing in said conductor portions.

15. A method of making an electrical current sensor for measuring a current (I; Ia, Ib) by detecting a magnetic field generated by this current, said sensor comprising at least one electrical conducting portion (6; 6a, 6b) of substantially rectangular cross-section having ends arranged so as to enable connection of said conductor portion in series with two conductors carrying the current to be measured, said conductor portion being surrounded, on three of said conductor portion's lateral faces, by a magnetic circuit portion (7) which comprises end portions (7', 7") having planar surfaces situated substantially in a plane of a fourth lateral face of said conductor portion (6), a magnetic field detector (3; 24; 26) being arranged opposite said fourth lateral face, wherein said conductor portion (6) is made by photo-lithography and etching in a layer of electrically conducting material applied on a first surface of a flat support member (1; 1'; 1") or on one or more intermediate layers or intermediate layer portions (8, 9, 10, 11) deposited on said first surface of this support member;

said magnetic circuit portion (7) is made by photo-lithography and etching in a layer of magnetically permeable material applied on said conductor portion (6) and on portions of said first surface of the support member (1; 1', 1") or of an intermediate layer (8); and said magnetic field detector (3; 26) is fixed to said support member (1; 1', 1") or on one or more layers or portions of intermediate layers (9, 10, 11) deposited on a second surface of the support member opposed to said first surface thereof and wherein the sensor is encapsulated, after provision of electrical connection portions, in an encapsulating material (13).

* * * * *

UNITED STATES PATENT AND TRADEMARK OFFICE
CERTIFICATE OF CORRECTION

PATENT NO. : 6,769,166 B1
DATED : August 3, 2004
INVENTOR(S) : Hubert Blanchard

It is certified that error appears in the above-identified patent and that said Letters Patent is hereby corrected as shown below:

Column 4,
Lines 19-20, please delete "connector" and insert in lieu thereof -- conductor --.

Signed and Sealed this

Nineteenth Day of October, 2004

JON W. DUDAS
*Director of the United States Patent and Trademark Office*